United States Patent
Chun et al.

(10) Patent No.: US 12,495,494 B2
(45) Date of Patent: Dec. 9, 2025

(54) METAL FOIL, CARRIER WITH METAL FOIL COMPRISING THE SAME AND PRINTED CIRCUIT BOARD INCLUDING THE SAME

(71) Applicant: YMT CO., LTD., Incheon (KR)

(72) Inventors: Sung Wook Chun, Incheon (KR); Bo Mook Chung, Incheon (KR); Dea Geun Kim, Incheon (KR); Myong Hwan Park, Incheon (KR); Nak Eun Ko, Bucheon-si (KR); Ju Yong Sim, Seoul (KR)

(73) Assignee: YMT CO., LTD, Incheon (KR)

( * ) Notice: Subject to any disclaimer, the term of this patent is extended or adjusted under 35 U.S.C. 154(b) by 116 days.

(21) Appl. No.: 18/038,671

(22) PCT Filed: Dec. 10, 2021

(86) PCT No.: PCT/KR2021/018712
§ 371 (c)(1),
(2) Date: May 24, 2023

(87) PCT Pub. No.: WO2022/124842
PCT Pub. Date: Jun. 16, 2022

(65) Prior Publication Data
US 2024/0015885 A1    Jan. 11, 2024

(30) Foreign Application Priority Data
Dec. 10, 2020   (KR) ........................ 10-2020-0172267

(51) Int. Cl.
*H05K 1/09*    (2006.01)
*H05K 1/02*    (2006.01)

(52) U.S. Cl.
CPC ............. *H05K 1/09* (2013.01); *H05K 1/0237* (2013.01); *H05K 2201/0355* (2013.01)

(58) Field of Classification Search
CPC ................... H05K 1/09; H05K 1/0237; H05K 2201/0355; H05K 2201/0364;
(Continued)

(56) References Cited

U.S. PATENT DOCUMENTS

| 5,958,209 A | * | 9/1999 | Sakai | ........................ | C25D 3/38 |
| | | | | | 205/241 |
| 2015/0053470 A1 | * | 2/2015 | Kawai | .................... | H05K 3/108 |
| | | | | | 174/258 |

(Continued)

FOREIGN PATENT DOCUMENTS

| CN | 110476276 A | * 11/2019 | ................ B26F 1/14 |
| JP | H10341066 A |   12/1998 | |

(Continued)

OTHER PUBLICATIONS

International search report of PCT/KR2021/018712, Mar. 15, 2022, English translation.

*Primary Examiner* — Stanley Tso
*Assistant Examiner* — Sidi M Maiga
(74) *Attorney, Agent, or Firm* — STIP Law Group, LLC

(57) ABSTRACT

The present invention relates to a metal foil having a rough surface, a carrier-attached metal foil including the metal foil, and a printed circuit board manufactured using the metal foil. The rough surface is naturally formed during formation of the metal foil. The formation of the rough surface allows the metal foil to have a high adhesive strength to an insulating resin substrate and enables the manufacture of a printed circuit board with improved efficiency.

7 Claims, 3 Drawing Sheets

(58) Field of Classification Search
CPC .......... H05K 2201/09209; H05K 2201/09381; H05K 2201/0373
USPC .......................................................... 174/261
See application file for complete search history.

(56) References Cited

U.S. PATENT DOCUMENTS

2017/0303405 A1* 10/2017 Fukuchi ................. H05K 3/022
2018/0255646 A1* 9/2018 Moriyama ........... H05K 3/0061

FOREIGN PATENT DOCUMENTS

| | | | |
|---|---|---|---|
| JP | 2001073171 | A | 3/2001 |
| JP | 2003013247 | A | 1/2003 |
| JP | 2003243785 | A | 8/2003 |
| JP | 2004095911 | A * | 3/2004 |
| JP | 2015069908 | A | 4/2015 |
| JP | 6656231 | B2 | 3/2020 |
| JP | WO2019012953 | A1 | 5/2020 |
| KR | 20020082797 | A | 10/2002 |
| KR | 20050045903 | A | 5/2005 |
| KR | 20130039749 | A | 4/2013 |
| KR | 20140128269 | A | 11/2014 |
| KR | 20180085086 | A | 7/2018 |
| KR | 102054673 | B1 | 12/2019 |
| KR | 20190143619 | A | 12/2019 |
| KR | 102070047 | B1 | 1/2020 |
| KR | 20200055963 | A | 5/2020 |

* cited by examiner

[Fig. 1]
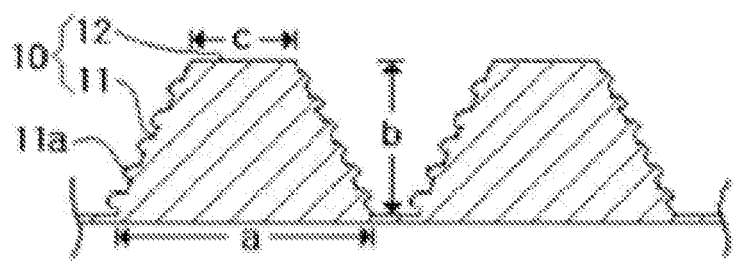
[Fig. 2]
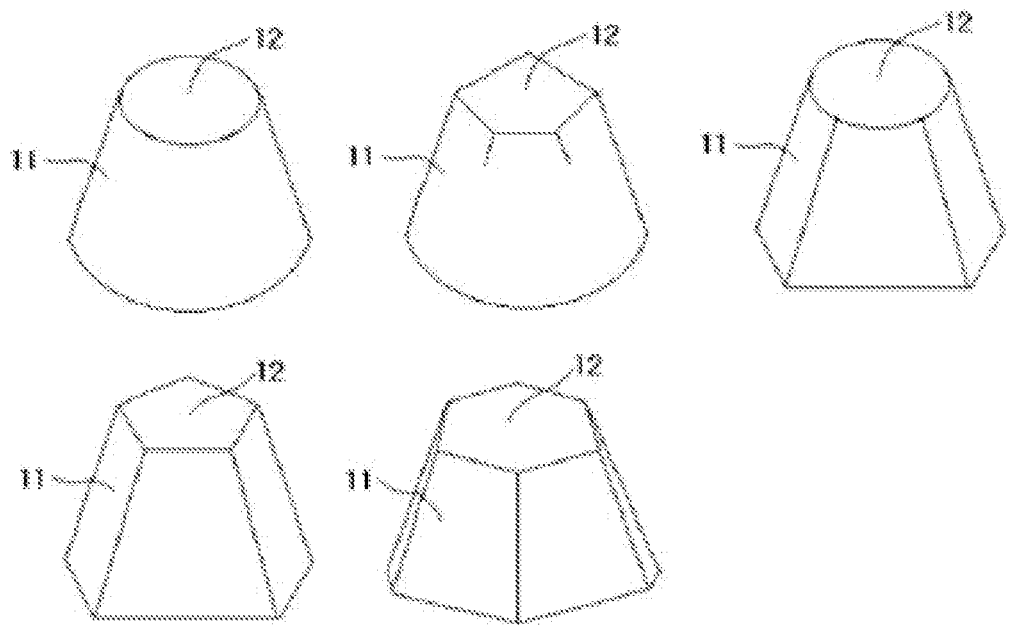

[Fig. 3]
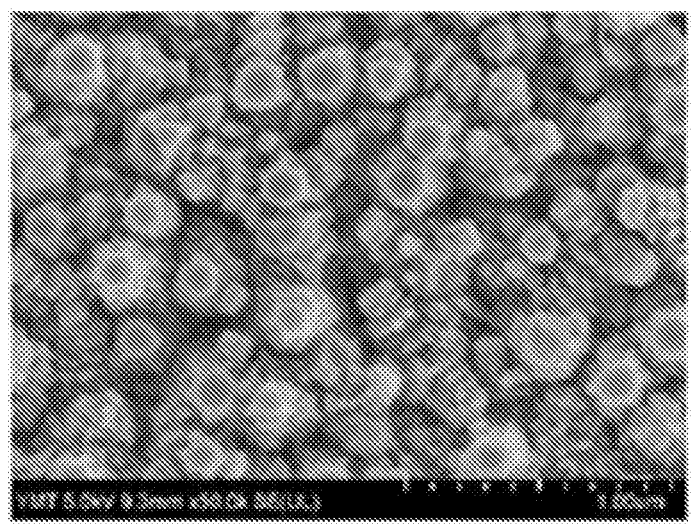
Example 1
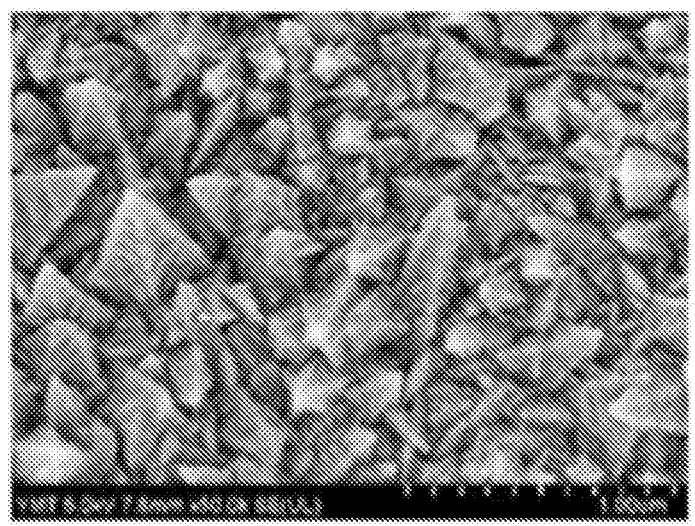
Comparative Example 1

[Fig. 4]
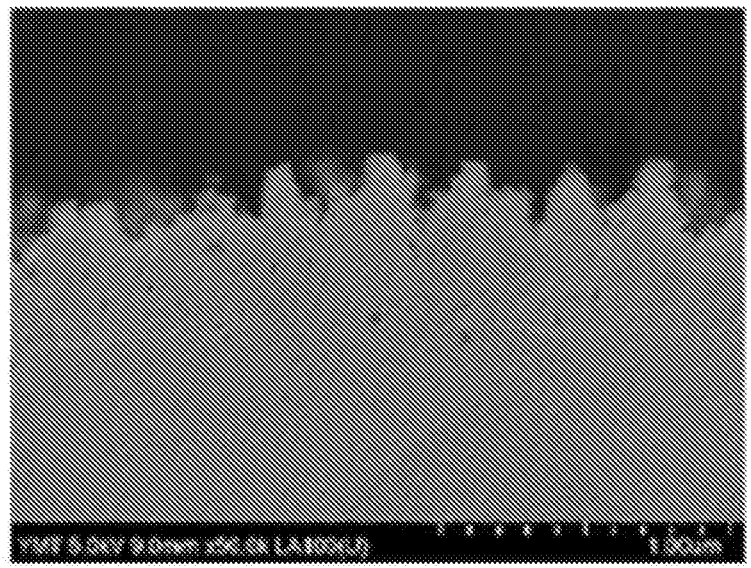
Example 1
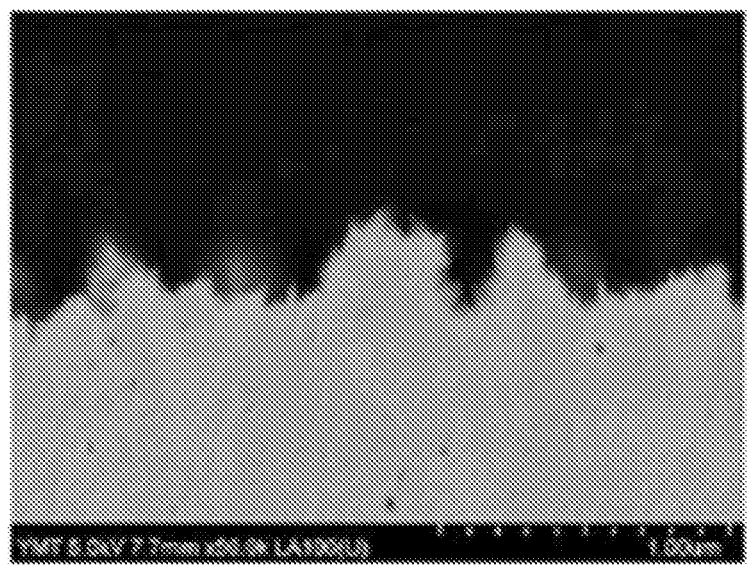
Comparative Example 1

METAL FOIL, CARRIER WITH METAL FOIL COMPRISING THE SAME AND PRINTED CIRCUIT BOARD INCLUDING THE SAME

TECHNICAL FIELD

The present invention relates to a metal foil having a rough surface, a carrier with metal foil including the same, and a printed circuit board manufactured using the metal foil.

CROSS-REFERENCE TO RELATED APPLICATIONS

This application is the U.S. National Phase under 35 U.S.C. § 371 of International Application No. PCT/KR2021/018712, filed on Dec. 10, 2021, which in turn claims the benefit of Korean Application No. 10-2020-0172267, filed on Dec. 10, 2020, the disclosures of which are incorporated by reference into the present application.

Background Art

A printed circuit board can be typically manufactured by bonding a metal foil to an insulating resin substrate and etching the metal foil for circuit wiring. A high adhesive strength between the metal foil and the insulating resin substrate is required to prevent the metal foil from being peeled off during circuit wiring.

Various proposals have been made to enhance the adhesion between metal foils and insulating resin substrates. For example, the adhesive strength between a metal foil and an insulating resin substrate is increased by roughening the surface of the metal foil to form irregularities thereon, placing the insulating resin substrate on the irregular surface of the metal foil, and pressing the insulating resin substrate to bond the insulating resin substrate to the metal foil. Specifically, Patent Document 1 discloses a method for enhancing the adhesion between a copper foil and a resin layer by electrolysis, blasting or oxidation-reduction of the surface of the copper foil at the resin layer side to form granular projections.

However, this method has a problem in that the additional roughening of the metal foil deteriorates the manufacturing efficiency of a printed circuit board. Further, the formation of the irregularities on the surface of the metal foil may deteriorate the transmission efficiency of high-frequency signals. With the trend toward higher performance of portable electronic devices, loss of high-frequency signal transmission needs to be minimized in order to rapidly process a large amount of information. However, the irregularities make the surface of the metal foil highly rough and act as obstacles to high-frequency signal transmission, resulting in inefficient high-frequency signal transmission.

Prior Art Documents

Patent Documents

Patent Document 1: Korean Patent Publication No. 2018-0019190

Disclosure of the Invention

Problems to be Solved by the Invention

The present invention intends to provide a metal foil that has a high adhesive strength to an insulating resin substrate and can prevent a decrease in the transmission efficiency of high-frequency signals.

The present invention also intends to provide a carrier-attached metal foil including the metal foil.

The present invention also intends to provide a printed circuit board including the metal foil.

Means for Solving the Problems

One aspect of the present invention provides a metal foil including a plurality of flat-topped projections.

Each of the projections may include a protrusion having a truncated cone or polygonal truncated pyramidal shape and a plateau formed at the upper end of the protrusion.

The protrusion may have a plurality of microprojections formed on the surface thereof.

The protrusion may have a surface roughness (Ra) of 0.05 to 0.3 μm.

The ratio of the height (b) of the protrusion to the length (a) of the base of the protrusion may be 0.4:1 to 1.5:1 (b:a).

The ratio of the length (c) of the plateau to the length (a) of the base of the protrusion may be 0.1:1 to 0.7:1 (c/a).

The polygonal truncated pyramidal shape may be selected from the group consisting of pentagonal truncated pyramidal, hexagonal truncated pyramidal, heptagonal truncated pyramidal, and octagonal truncated pyramidal shapes.

The projections may be formed by electroless plating.

A further aspect of the present invention provides a carrier-attached metal foil including a carrier, a release layer formed on the carrier, and a metal layer formed on the release layer wherein the metal foil is used as the metal layer.

Another aspect of the present invention provides a printed circuit board including a metal circuit layer wherein the metal foil formed with circuit wires is used as the metal circuit layer.

Effects of the Invention

The formation of the flat-topped projections on the surface of the metal foil according to the present invention allows the metal foil to have a high adhesive strength to an insulating resin substrate and can minimize loss of high-frequency signal transmission. The plurality of projections are naturally formed on the metal foil of the present invention during electroless plating, avoiding the need for additional roughening for forming irregularities on the metal foil, unlike in the prior art. Therefore, the use of the metal foil according to the present invention enables the manufacture of a printed circuit board with high efficiency.

BRIEF DESCRIPTION OF THE DRAWINGS

FIG. 1 illustrates a portion of the surface of a metal foil according to one embodiment of the present invention.

FIG. 2 illustrates the shapes of projections that may be formed on a metal foil according to one embodiment of the present invention.

FIGS. 3 and 4 show the results of Test Example 1.

DETAILED DESCRIPTION FOR CARRYING OUT THE INVENTION

The terminologies and words used in this specification and claims should not be interpreted as being limited to usual or lexical meaning, but should be interpreted as meanings and concepts corresponding to the technical ideas of the present invention based on the principle that the inventor can properly define the concepts of the terminologies to best describe his/her own invention.

It will be understood that when an element is referred to as being "on" another element, it can be directly on the other element or intervening elements may also be present. In the case where an element and another element change in position relative to each other, "on" can be interpreted as "under".

The present invention will now be described in detail with reference to the accompanying drawings.

Referring to FIG. 1, a metal foil 100 of the present invention includes a plurality of flat-topped projections 10. The projections 10 may metal crystal particles protruding vertically upward from the surface of the metal foil 100. Specifically, each of the projections 10 may include a protrusion 11 and a plateau 12.

The protrusions 11 of the projections 10 are portions protruding from the surface of the metal foil 100 and may have a truncated cone or polygonal truncated pyramidal shape. Specifically, the protrusions 11 have a truncated cone shape with a flat surface (lateral surface) or a polygonal truncated pyramidal shape with angled surfaces, as illustrated in FIG. 2. This shape can enhance the anchorage of the metal foil to an insulating resin substrate so that the metal foil 100 can be bonded to the insulating resin substrate with a high adhesive strength. More specifically, the protrusions 11 may have at least one polygonal truncated pyramidal shape selected from the group consisting of pentagonal truncated pyramidal, hexagonal truncated pyramidal, heptagonal truncated pyramidal, and octagonal truncated pyramidal shapes.

Each of the protrusions 11 may have a plurality of microprojections 11a to enhance the adhesion to an insulating resin substrate due to its increased surface area. The formation of the microprojections 11a allows the protrusions 11 to have a surface roughness (Ra) of 0.05 to 0.3 μm, specifically 0.08 to 0.2 μm. Here, the surface roughness (Ra) of the protrusions 11 is defined as that of the lateral surfaces of the protrusions 11 other than the plateaus 12.

Meanwhile, the ratio of the height (b) of each protrusion 11 to the length (a) of the base of the protrusion 11 may be in the range of 0.4:1 to 1.5:1 (b:a), specifically, 0.6:1 to 1.2:1 (b:a). When the ratio (b:a) is within the range defined above, the adhesion between the metal foil 100 and an insulating resin substrate can be enhanced and loss of high-frequency signal transmission can be minimized.

The plateaus 12 of the projections 10 are flat surfaces of the upper ends of the protrusions 11. The plateaus 12 may be upper surfaces of the protrusions 11 having a truncated cone or polygonal truncated pyramidal shape. According to the prior art, particles protrude sharply or roundly from the surface of a metal foil to form irregularities that make the surface of the metal foil highly rough. The formation of the irregularities can enhance the adhesion to an insulating resin substrate but leads to loss of high-frequency signal transmission. In contrast, the plateaus 12 forming the top surfaces (top ends) of the projections 10 allow the metal foil 100 of the present invention to have a relatively low surface roughness due to their flatness. The relatively low surface roughness minimizes loss of high-frequency signal transmission. Specifically, the plateaus 12 may have a circular, elliptical or polygonal shape. Fine irregularities may be densely formed to provide flat surfaces, which can also be considered to be encompassed within the scope of the plateaus 12.

In each of the projections 10, the ratio of the length (c) of the plateau 12 to the length (a) of the base of the protrusion 11 may be in the range of 0.1:1 to 0.7:1, specifically 0.2:1 to 0.6:1. When the ratio (c:a) is within the range defined above, the adhesion between the metal foil 100 and an insulating resin substrate can be enhanced and loss of high-frequency signal transmission can be minimized. The length (c) of the plateau 12 refers to the largest length in the plane of the plateau 12.

The number of the projections 10 per unit area (1 μm$^2$) of the metal foil 100 may be 25 or less, specifically 5 to 20, more specifically 7 to 15, taking into consideration the adhesion between the metal foil 100 and an insulating resin substrate, the transmission efficiency of high-frequency signals, the circuit wire resolution of the metal foil 100, etc.

The projections 10 may be formed by electroless plating. Specifically, the projections 10 can be formed on the surface of the metal foil 100 by forming a metal seed foil by electroless plating, after which crystal grains continuously grow on the metal seed foil. According to the prior art, irregularities are formed by additional roughening of a metal foil. In contrast, the plurality of projections 10 naturally form a rough surface in the course of forming the metal foil 100 of the present invention. Thus, the need for additional roughening is avoided, enabling the formation of the metal foil 100 and/or the manufacture of a printed circuit board with high efficiency. In addition, electroless plating makes the metal foil 100 smaller in thickness and more porous than electroplating.

The composition of an electroless plating solution used to form the metal foil 100 is not particularly limited and may include a metal ion source and a nitrogenous compound.

The metal ion source may be specifically a copper ion source selected from the group consisting of copper sulfate, copper chloride, copper nitrate, copper hydroxide, copper sulfamate, and mixtures thereof. The metal ion source may be present at a concentration of 0.5 to 300 g/L, specifically 100 to 250 g/L.

The nitrogenous compound diffuses metal ions to form the plurality of projections 10 on the surface of a metal seed foil formed by the metal ion source. Specifically, the nitrogenous compound may be selected from the group consisting of purine, adenine, guanine, hypoxanthine, xanthine, pyridazine, methylpiperidine, 1,2-di-(2-pyridyl)ethylene, 1,2-di-(pyridyl)ethylene, 2,2'-dipyridylamine, 2,2'-bipyridyl, 2,2'-bipyrimidine, 6,6'-dimethyl-2,2'-dipyridyl, di-2-furyl ketone, N,N,N',N'-tetraethylenediamine, 1,8-naphthyridine, 1,6-naphthyridine, terpyridine, and mixtures thereof. The nitrogenous compound may be present at a concentration of 0.01 to 10 g/L, specifically 0.05 to 1 g/L.

The electroless plating solution may further include one or more additives selected from the group consisting of a chelating agent, a pH adjusting agent, and a reducing agent.

Specifically, the chelating agent may be selected from the group consisting of tartaric acid, citric acid, acetic acid, malic acid, malonic acid, ascorbic acid, oxalic acid, lactic acid, succinic acid, potassium sodium tartrate, dipotassium tartrate, hydantoin, 1-methylhydantoin, 1,3-dimethylhydantoin, 5,5-dimethylhydantoin, nitriloacetic acid, triethanolamine, ethyl enedi aminetetraac etic acid, tetrasodium ethyl enedi aminetetraacetate, N-hydroxyethylenediamine triacetate, pentahydroxypropyldiethylenetriamine, and mixtures thereof. The chelating agent may be present at a concentration of 0.5 to 600 g/L, specifically 300 to 450 g/L.

Specifically, the pH adjusting agent may be selected from the group consisting of sodium hydroxide, potassium hydroxide, lithium hydroxide, and mixtures thereof. The pH adjusting agent can adjust the pH of the electroless plating solution to 8 or higher, specifically 10 to 14, more specifically 11 to 13.5.

Specifically, the reducing agent may be selected from the group consisting of formaldehyde, sodium hypophosphite, sodium hydroxymethanesulfinate, glyoxylic acid, borohydride, dimethylamine borane, and mixtures thereof. The reducing agent may be present at a concentration of 1 to 20 g/L, specifically 5 to 20 g/L.

The conditions for the electroless plating to form the metal foil 100 may be appropriately adjusted depending on the thickness of the metal foil 100. Specifically, the electroless plating temperature may be 20 to 60° C., specifically 25 to 40° C. and the electroless plating time may be 2 to 30 minutes, specifically 5 to 20 minutes.

The thickness of the metal foil 100 formed by electroless plating may be 5 μm or less, specifically 0.1 to 1 μm. The component of the metal foil 100 is not particularly limited and may be any known metal that can form a circuit layer of a printed circuit board. Specifically, the metal may be selected from the group consisting of copper, silver, gold, nickel, aluminum, and mixtures thereof.

The present invention also provides a carrier-attached metal foil including the metal foil. Specifically, the carrier-attached metal foil includes a carrier, a release layer, and a metal layer wherein the metal foil is used as the metal layer. The carrier-attached metal foil will be described in detail below.

The carrier of the carrier-attached metal foil according to the present invention serves to prevent the metal layer from being deformed during transport or use of the carrier-attached metal foil. The carrier 300 is made of a metal such as copper or aluminum. Alternatively, the carrier 300 may be made of a polymer such as polyethylene terephthalate (PET), polyphenylene sulfide (PPS) or Teflon. The thickness of the carrier may be specifically 10 to 50 μm.

The release layer of the carrier-attached metal foil is designed for easy removal of the carrier from the carrier-attached metal foil bonded to an insulating resin substrate. The release layer may have a monolayer or multilayer structure. Specifically, the release layer may have a monolayer structure containing a nitrogenous cyclic compound as an organic material and a metal selected from the group consisting of nickel, molybdenum, cobalt, phosphorus, manganese, and iron. Alternatively, the release layer may have a multilayer structure in which an organic layer composed of a nitrogenous cyclic compound is bonded to an alloy layer including one or more metals selected from the group consisting of nickel, molybdenum, cobalt, phosphorus, manganese, and iron. The release layer may have a thickness of 30 nm to 1 μm.

The metal foil is used as the metal layer of the carrier-attached metal foil and a detailed description thereof is thus omitted.

The carrier-attached metal foil of the present invention may further include an electrolytic metal layer formed on the metal layer to enhance the mechanical strength and conductivity of the metal layer. The electrolytic metal layer may be composed of a component identical to or different from that of the metal layer.

The carrier-attached metal foil of the present invention may further include an anti-rusting layer formed on the metal layer to protect the metal layer from rusting. For example, the anti-rusting layer may include zinc or chromium.

The carrier-attached metal foil of the present invention may further include a diffusion barrier layer formed between the carrier and the alloy layer of the release layer to improve its performance. For example, the diffusion barrier layer may include nickel or phosphorus.

The carrier-attached metal foil of the present invention may further include an oxidation barrier layer formed between the organic layer of the release layer and the metal layer. For example, the oxidation barrier layer may include nickel or phosphorus.

The present invention also provides a printed circuit board manufactured using the metal foil. Specifically, the printed circuit board of the present invention includes a metal circuit layer and an insulating resin layer. The metal circuit layer is derived from the metal foil, which will be described below.

The metal circuit layer of the printed circuit board is a layer where circuit wires are formed. The metal circuit layer is obtained by forming circuit wires on the metal foil. The metal foil ensures miniaturization and high resolution of the printed circuit board. Specifically, the printed circuit board of the present invention is manufactured by bonding the insulating resin substrate and the metal foil to form a laminate and etching the laminate to form circuit wires on the metal foil. The metal foil is bonded to the insulating resin substrate with a high adhesive strength and has a relatively small thickness, enabling the formation of fine and high-resolution circuit wires thereon. In addition, the circuit wires formed on the metal foil have a high adhesive strength to the insulating resin substrate.

There is no particular restriction on the method for forming the circuit wires. For example, the circuit wires may be formed by a subtractive process, an additive process, a full additive process, a semi-additive process or a modified semi-additive process.

The insulating resin layer of the printed circuit board is an insulating layer formed on the metal circuit layer. The insulating resin layer may be any suitable insulating resin substrate well known in the art. Specifically, the insulating resin layer may be a resin substrate having a structure in which a well-known resin is impregnated into an inorganic or organic fiber. For example, the resin substrate may be a prepreg.

The printed circuit board of the present invention may be manufactured using an insulating resin substrate or by a coreless process without using an insulating resin substrate.

The present invention will be more specifically explained with reference to the following examples. However, these examples are provided for illustrative purposes and are not intended to limit the scope of the present invention. Those skilled in the art will appreciate that various modifications and variations are possible without departing from the scope and spirit of the invention.

EXAMPLE 1

A copper (Cu) foil carrier was bonded to a release layer (an alloy layer composed of nickel and molybdenum+ an organic layer composed of sodium mercaptobenzotriazole) to prepare a laminate. The laminate was subjected to electroless plating in an electroless plating bath to form a 1 μm thick metal foil (copper foil) on the release layer. An electroless plating solution containing 190-200 g/L $CuSO_4 \cdot 5H_2O$ as a metal ion source, 0.01-0.1 g/L guanine as a nitrogenous compound, 405-420 g/L potassium sodium tartrate as a chelating agent, NaOH as a pH adjusting agent, and 28% formaldehyde as a reducing agent was used for the electroless plating. The electroless plating was performed at 30° C. for 10 min.

COMPARATIVE EXAMPLE 1

A metal foil (copper foil) was formed in the same manner as in Example 1, except that electroless plating was performed in an electroless plating solution containing 200-210 g/L $CuSO_4 \cdot 5H_2O$ and $NiSO_4 \cdot 6H_2O$ as metal ion sources, 0.5-0.8 g/L 2,2-bipyridine as a nitrogenous compound, 405-420 g/L potassium sodium tartrate as a chelating agent, and 28% formaldehyde as a reducing agent at 34° C. for 20 min.

TEST EXAMPLE 1

The surfaces and cross sections of the metal foils formed in Example 1 and Comparative Example 1 were analyzed with a scanning electron microscope (SEM) and an ion beam cross section polisher (CP). The results are shown in FIGS. 3 and 4.

Referring to FIGS. 3 and 4, the inventive metal foil of Example 1 had a plurality of flat-topped surface projections whereas the metal foil of Comparative Example 1 had a plurality of sharp-topped surface projections.

TEST EXAMPLE 2

The adhesiveness of each of the metal foils formed in Example 1 and Comparative Example 1 was evaluated by the following procedure. A SUS plate, a craft paper, a release film, an insulating resin substrate (DS-7409HG), the metal foil formed in Example 1 or Comparative Example 1 (including the release layer), a craft paper, and a SUS plate were laminated in this order and pressed under vacuum at a pressure of 3.5 MPa and a temperature of 200° C. for 100 min to prepare a laminate. After removal of the craft paper and the SUS plate from the laminate through the release layer, the peel strength between the metal foil and the insulating resin substrate was evaluated by the IPC-TM-650 test method (BMSP-90P Peel tester, test speed: 50 mm/min, test angle: 90°). The results are shown in Table 1.

TABLE 1

| | Peel strength (gf/cm) |
|---|---|
| Laminate including the metal foil of Example 1 | 850 |
| Laminate including the metal foil of Comparative Example 1 | 730 |

As can be seen from the results in Table 1, the peel strength between the metal foil and the insulating resin substrate of the laminate including the inventive metal foil of Example 1 was higher.

Test Example 3

The high-frequency signal transmission performance of a printed circuit board including each of the metal foils formed in Example 1 and Comparative Example 1 was evaluated by the following procedure. A copper foil (18 μm thick), an insulating resin substrate (DS-7402, 50 μm thick), and the metal foil formed in Example 1 or Comparative Example 1 were laminated in this order and wires (width: 40 μm, length: 10 cm) were formed on the metal foil by mSAP. An insulating resin substrate (DS-7402) and a copper foil were laminated on the metal foil where the wires were formed, and through holes were processed to manufacture a printed circuit board. The high-frequency signal transmission performance of the printed circuit board was measured using PNA N5225A (KEYSIGHT). $S_{21}$ parameters (dB) were measured at 10 MHz to 40 GHz. The results are shown in Table 2.

TABLE 2

| | 10 MHz (dB) | 10 GHz (dB) | 20 GHz (dB) | 30 GHz (dB) | 40 GHz (dB) |
|---|---|---|---|---|---|
| Printed circuit board including the metal foil of Example 1 | −0.226 | −7.701 | −13.966 | −19.345 | −25.556 |
| Printed circuit board including the metal foil of Comparative Example 1 | −0.244 | −8.427 | −15.419 | −21.331 | −27.993 |

The results in Table 2 demonstrated that the high-frequency signal transmission performance of the printed circuit board including the metal foil of Example 1 was higher.

Explanation of reference numerals

100: Metal foil
10: Projection
11: Protrusion
11a: Microprojection
12: Plateau

The invention claimed is:

1. A metal foil comprising a plurality of flat-topped projections,
   wherein,
   each of the projections comprises a protrusion having a truncated cone or polygonal truncated pyramidal shape and a plateau formed at the upper end of the protrusion, and
   the ratio of the length (c) of the plateau to the length (a) of the base of the protrusion is 0.1:1 to 0.7:1 (c/a),
   wherein the protrusion has a surface roughness (Ra) of 0.05 to 0.3 μm, and the surface roughness of the protrusion is defined as that of lateral surfaces of the protrusion other than the plateau,
   wherein the flat-topped projections comprise metal crystal particles protruding vertically upward from the surface of the metal foil.

2. The metal foil according to claim 1, wherein the protrusion has a plurality of microprojections formed on the surface thereof.

3. The metal foil according to claim 1, wherein the ratio of the height (b) of the protrusion to the length (a) of the base of the protrusion is 0.4:1 to 1.5:1 (b: a).

4. The metal foil according to claim 1, wherein the polygonal truncated pyramidal shape is selected from the group consisting of pentagonal truncated pyramidal, hexagonal truncated pyramidal, heptagonal truncated pyramidal, and octagonal truncated pyramidal shapes.

5. The metal foil according to claim 1, wherein the projections are formed by electroless plating.

6. A carrier-attached metal foil comprising a carrier, a release layer formed on the carrier, and a metal layer formed on the release layer wherein the metal foil according to claim 1 is used as the metal layer.

7. A printed circuit board comprising a metal circuit layer wherein the metal foil according to claim 1 formed with circuit wires is used as the metal circuit layer.

\* \* \* \* \*